(12) United States Patent
Lee (10) Patent No.: US 7,532,534 B2
(45) Date of Patent: May 12, 2009

(54) VOLTAGE GENERATING CIRCUIT AND SEMICONDUCTOR MEMORY DEVICE HAVING THE SAME

(75) Inventor: Dong-Su Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 159 days.

(21) Appl. No.: 11/267,844

(22) Filed: Nov. 4, 2005

(65) Prior Publication Data

US 2006/0098501 A1    May 11, 2006

(30) Foreign Application Priority Data

Nov. 5, 2004    (KR) ..................... 10-2004-0090024

(51) Int. Cl.
  *G11C 5/14*    (2006.01)
  *G11C 7/00*    (2006.01)
  *G11C 8/00*    (2006.01)

(52) U.S. Cl. .................. 365/226; 365/189.09; 365/203; 365/205; 365/207; 365/230.03

(58) Field of Classification Search ................. 365/226, 365/203, 205, 207, 208, 230.03, 189.09, 365/189.11
See application file for complete search history.

(56) References Cited

U.S. PATENT DOCUMENTS

| | | | | |
|---|---|---|---|---|
| 5,517,462 A | * | 5/1996 | Iwamoto et al. | 365/203 |
| 5,875,146 A | * | 2/1999 | Itou | 365/226 |
| 5,903,513 A | * | 5/1999 | Itou | 365/207 |
| 6,021,082 A | * | 2/2000 | Shirai | 365/226 |
| 6,064,621 A | * | 5/2000 | Tanizaki et al. | 365/230.03 |
| 6,115,316 A | * | 9/2000 | Mori et al. | 365/226 |
| 6,166,990 A | * | 12/2000 | Ooishi et al. | 365/226 |
| 6,229,753 B1 | * | 5/2001 | Kono et al. | 365/230.03 |
| 6,262,930 B1 | * | 7/2001 | Mori et al. | 365/226 |
| 6,496,438 B2 | * | 12/2002 | Saito | 365/226 |
| 6,704,237 B2 | * | 3/2004 | Park | 365/226 |
| 6,721,232 B2 | * | 4/2004 | Kashiwazaki | 365/226 |
| 6,731,562 B2 | * | 5/2004 | Roohparvar | 365/226 |
| 6,744,689 B2 | * | 6/2004 | Itou | 365/226 |
| 7,046,571 B2 | * | 5/2006 | Kim et al. | 365/226 |
| 7,102,936 B2 | * | 9/2006 | Kim et al. | 365/226 |
| 7,123,536 B2 | * | 10/2006 | Kang | 365/226 |
| 7,193,920 B2 | * | 3/2007 | Byeon et al. | 365/226 |
| 7,227,794 B2 | * | 6/2007 | Kang | 365/226 |

FOREIGN PATENT DOCUMENTS

| | | |
|---|---|---|
| JP | 10-1992-17102 | 9/1992 |
| KR | 10-2000-0020963 | 4/2000 |
| KR | 10-2001-0009806 | 2/2001 |
| KR | 10-2003-0043411 | 6/2003 |

* cited by examiner

*Primary Examiner*—Trong Phan
(74) *Attorney, Agent, or Firm*—Mills & Onello, LLP (57) ABSTRACT

The present invention provides a voltage generating circuit and a semiconductor memory device having the same. The voltage generating circuit includes an internal voltage generating portion for generating an internal voltage in response to a signal input from an external portion; a sensing portion for outputting a sensing signal when the signal input from the external portion is input again within a predetermined time period; a control signal generating portion for outputting a control signal in response to the sensing signal; and a compensating portion for compensating the internal voltage in response to the control signal.

14 Claims, 12 Drawing Sheets

VOLTAGE GENERATING CIRCUIT AND SEMICONDUCTOR MEMORY DEVICE HAVING THE SAME

CROSS-REFERENCE TO RELATED APPLICATION

This application claims the benefit of Korean Patent Application No. 2004-0090024, filed on Nov. 5, 2004, the contents of which are hereby incorporated herein by reference in their entirety.

BACKGROUND OF THE INVENTION

1. Field of the Invention

The present invention relates to a semiconductor memory device and, more particularly, to a voltage generating circuit which compensates and outputs an output voltage in a case where operation requiring an output voltage of a predetermined level is continuously performed, and a semiconductor memory device having the same.

2. Description of the Related Art

In a typical semiconductor memory device, a memory cell array is comprised of a plurality of banks to make a data input/output (IO) process faster. The data IO process is performed through a process for activating or precharging a word line and a process for sensing and amplifying signals of bit line pair.

In the semiconductor memory device with such a multi-bank structure, in order to prevent a size of the semiconductor memory device from being too large as the number of banks is increased, a high voltage generating circuit for activating the word line, a precharge circuit for precharging the word line, and an internal voltage generating circuit for performing a bit line sensing operation are shared by a plurality of banks. However, the conventional semiconductor memory device has a problem that the high voltage generating circuit, the precharge circuit and the internal voltage generating circuit may not be supplied with sufficient voltage needed for their operation as the semiconductor memory device operates at high speed.

Figure 1:
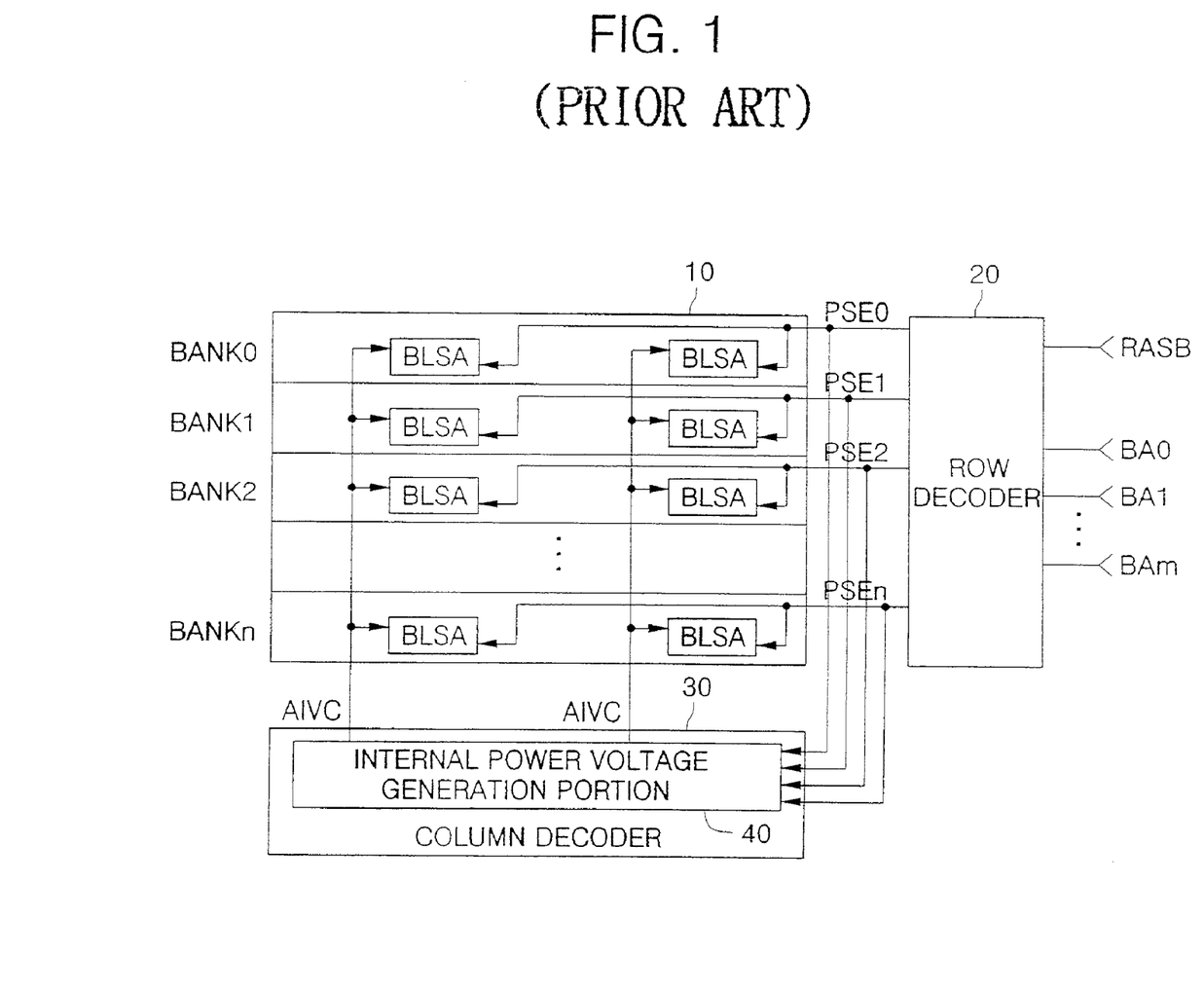
FIG. 1 is a block diagram illustrating a conventional semiconductor memory device with a multi-bank structure.

FIG. 1 is a block diagram illustrating a conventional semiconductor memory device with a multi-bank structure. The semiconductor memory device of FIG. 1 includes a memory cell array 10, a row decoder 20, a column decoder 30, and an internal voltage generating portion 40. The memory cell array 10 is comprised of a plurality of banks BANK0 to BANKn, and each bank includes a plurality of bit line sense amplifiers BLSA.

In FIG. 1, AIVC denotes an internal power voltage needed for sensing or amplifying data of a memory cell, PSE0 to PSEn denote bit line sense enable signals for operating the bit line sense amplifiers BLSA, RASB denotes a row activation command input from the external portion, and BA0 to BAm denote bank address signals input from the external portion.

Functions of the components FIG. 1 are described below.

The memory cell array 10 is comprised of a plurality of memory cells (not shown) and stores or outputs data in response to a command and an address signal which are input from the external portion. The bit line sense amplifiers BLSA in the memory cell array 10 senses or amplifies data transmitted to/from the memory cell (not shown) in response to the bit line sense enable signals PSE0 to PSEn. The row decoder 20 outputs the bit line sense enable signals. PSE0 to PSEn for operating the bit line sense amplifiers BLSA in response to the row activation command RASB and the bank address signals BA0 to BAm. The column decoder 30 activates a column selecting signal in response to a column address signal input from the external portion. The internal voltage generating portion 30 supplies a plurality of bit line sense amplifiers BLSA with the internal power voltage AIVC in response to the bit line sense enable signals PSE0 to PSEn.

FIG. 1 shows that the internal power voltage generating portion 40 is arranged in the column decoder 30, but the internal power voltage generating portion 40 may be arranged in a conjunction region where the row decoder 20 and the column decoder 30 meet.

Even though not shown in FIG. 1, a peripheral circuit region which includes the high voltage generating circuit for outputting a high voltage needed to activate the word line and the precharge voltage generating portion for outputting a precharge voltage needed to precharge the word line are arranged below the column decoder 30. As described above, the high voltage output from the high voltage generating circuit and the precharge voltage output from the precharge voltage generating circuit are commonly applied to a plurality of banks BANK0 to BANKn.

Figure 2:
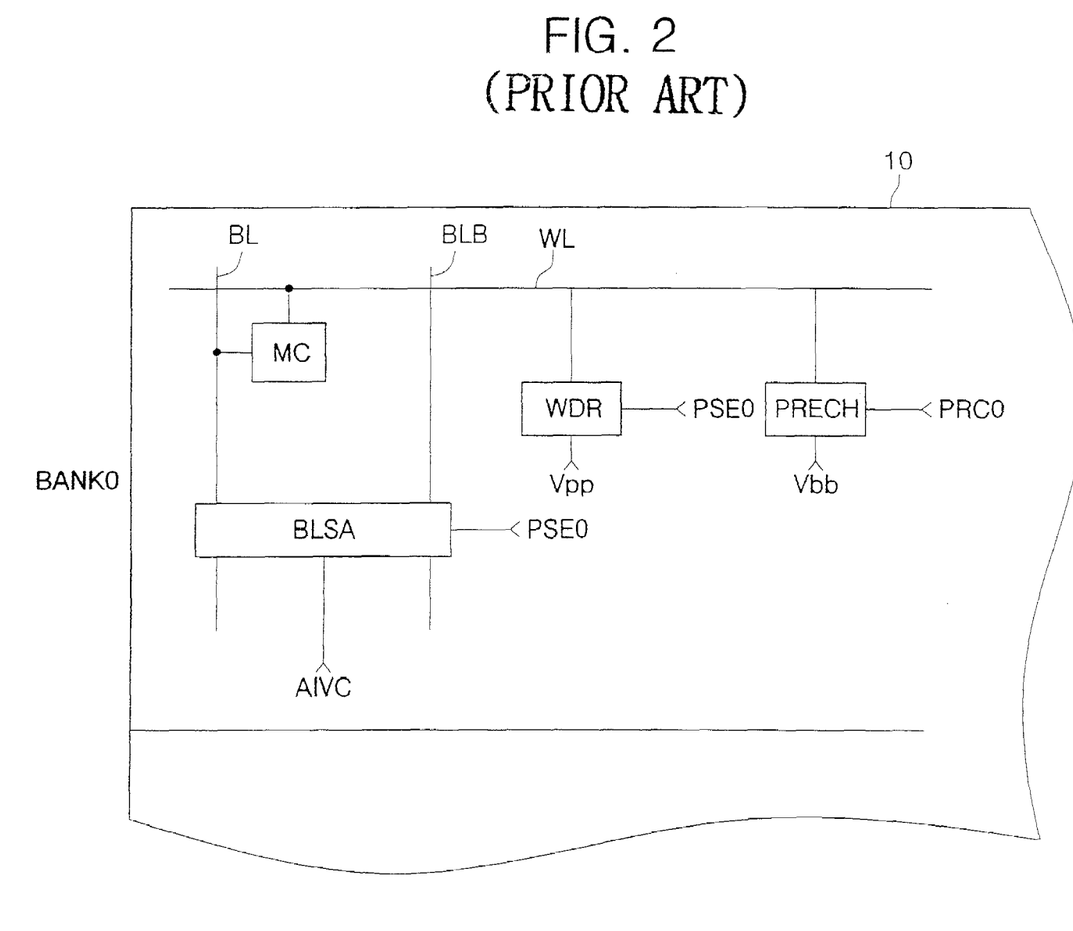
FIG. 2 is a block diagram illustrating part of a memory cell array of the semiconductor memory device of FIG. 1.

FIG. 2 is a block diagram illustrating part of the memory cell array of the semiconductor memory device of FIG. 1. In FIG. 2, BL and BLB denote a bit line pair, WL denotes a word line, MC denote a memory cell, BLSA denotes a bit line sense amplifier, WDR denotes a word line driver, PRECH denotes a precharge circuit, AIVC denotes an internal power voltage output from the internal power voltage generating portion 40, Vpp denotes a high voltage output from the high voltage generating portion, Vbb denotes a precharge voltage output from the precharge voltage generating circuit, PSE0 denotes a bit line sense enable signal, and PRC0 denotes a precharge signal.

Functions of the components of FIG. 2 and operation of the memory cell array are described below.

The word line driver WDR activates the word line WL to the high voltage Vpp in response to the bit line sense enable signal PSE0. The bit line sense amplifier BLSA senses and amplifies data of the bit line pair BL, BLB using the internal power voltage AIVC in response to the bit line sense enable signal PSE0. The precharge circuit PRECH precharges the word line WL to the precharge voltage Vbb in response to the precharge signal PRC0.

That is, when the bit line sense enable signal PSE0 is activated, the word line WL is activated to the high voltage Vpp, and data of the memory cell MC is output through the bit line pair BL, BLB. When the bit line sense enable signal PSE0 is activated, the internal power voltage is applied to the bit line sense amplifier BLSA, and the bit line sense amplifier BLSA senses and amplifies the data using the internal power voltage AIVC. Next, when the precharge signal PRC0 is activated, the word line is precharged to the precharge voltage Vbb.

Figure 3:
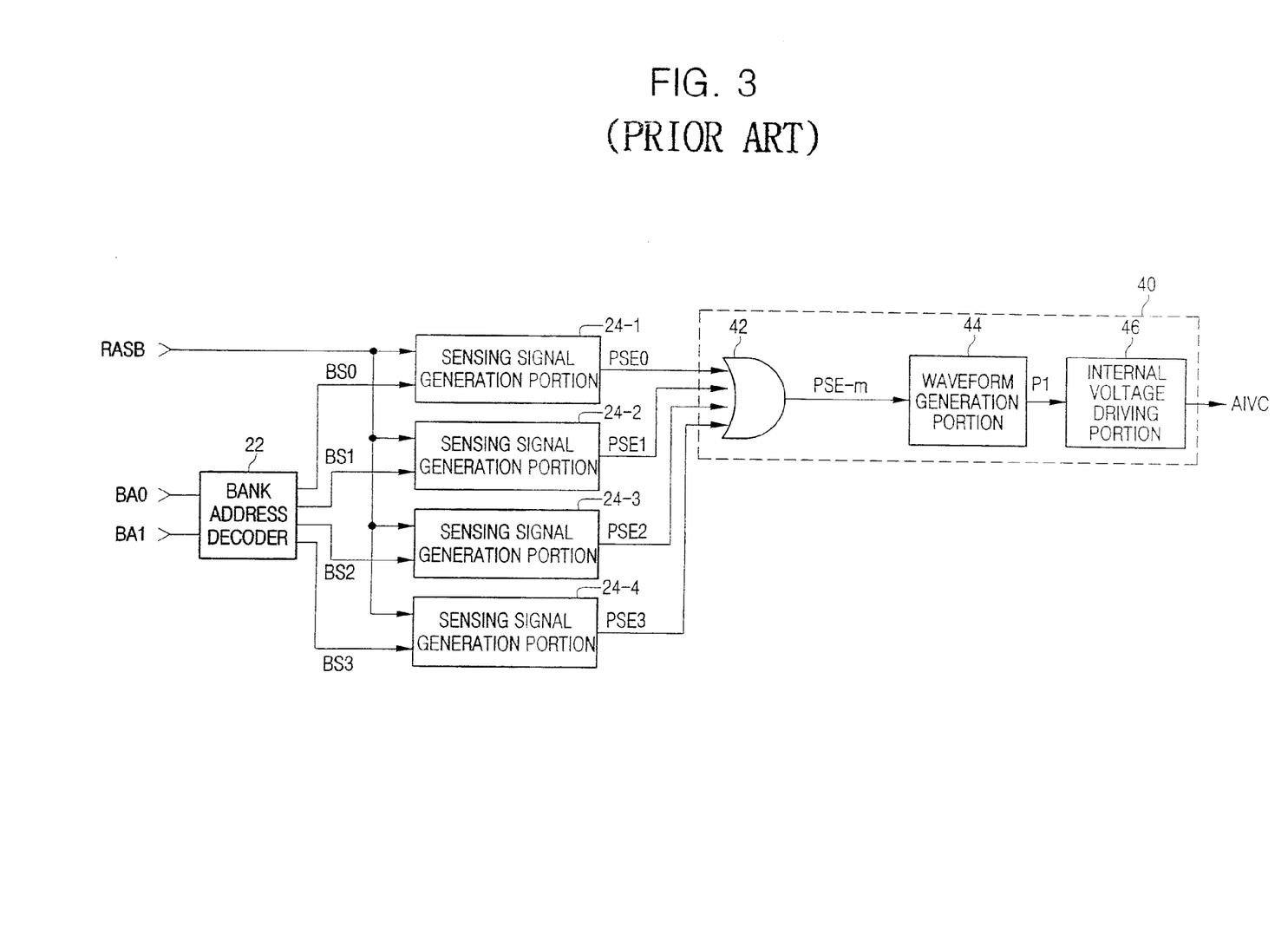
FIG. 3 is a block diagram illustrating an internal power voltage generating circuit of the conventional semiconductor memory device whose memory cell array is comprised of four banks.

FIG. 3 is a block diagram illustrating the internal power voltage generating circuit of the conventional semiconductor memory device whose memory cell array is comprised of four banks. The internal power voltage generating circuit of FIG. 3 includes a bank address decoder 22, four sensing signal generating portions 24-1 to 24-4, and an internal power voltage outputting portion 40. The internal power voltage outputting portion 40 includes an OR gate 42, a waveform generating portion 44, and an internal voltage driving portion 46.

Functions of the components of FIG. 3 are described below.

The bank address decoder 22 outputs bank selecting signals BS0 to BS3 in response to bank address signals BA0 and BA1 input from the external portion. The four sensing signal generating portions 24-1 to 24-4 output the bit line sense enable signals PSE0 to PSE3 in response to the row activation command RASB and the bank selecting signals BS0 to BS3 input from the external portion, respectively. The internal power voltage outputting portion 40 outputs the internal power voltage AIVC needed for sensing and amplifying data in response to the bit line sense enable signals PSE0 to PSE3.

The OR gate 42 outputs a sense master signal PSE-m in response to the bit line sense enable signals PSE0 to PSE3. That is, when at least one of the bit line sense enable signals PSE0 to PSE3 is activated, the sense master signal PSE-m is activated. The waveform generating portion 44 outputs a first control signal P1 in response to the sense master signal PSE-m. That is, the waveform generating portion 44 outputs the first control signal P1 which delays the sense master signal PSE-m during a predetermined time period and has a predetermined pulse width. The internal voltage driving portion 46 outputs the internal power voltage AIVC in response to the first control signal P1.

Figure 4:
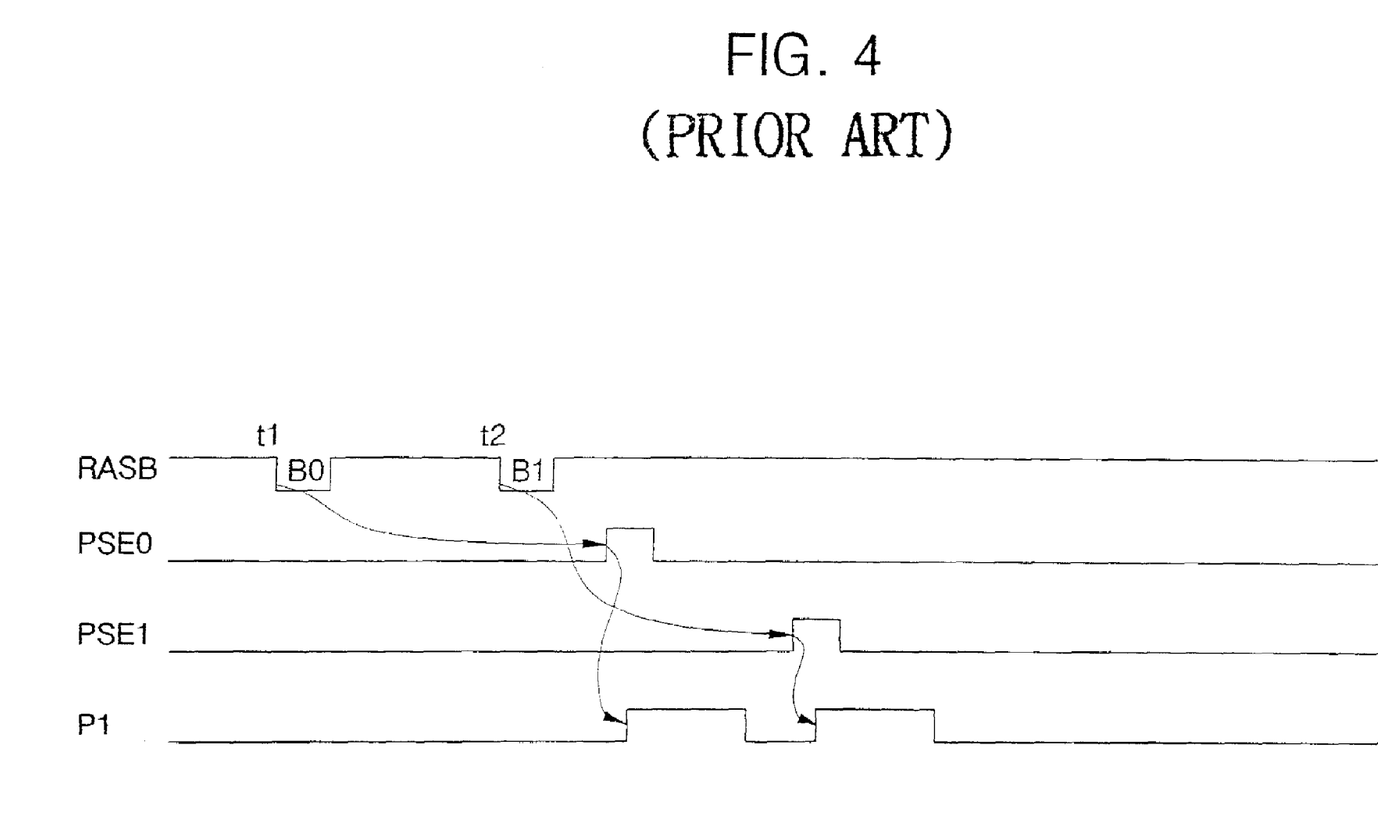
FIG. 4 is a timing diagram illustrating operation of the internal power voltage generating circuit of the conventional semiconductor memory device of FIG. 3.

FIG. 4 is a timing diagram illustrating operation of the internal power voltage generating circuit of the conventional semiconductor memory device of FIG. 3. In FIG. 4, RASB denotes a row activation command, PSE0 and PSE1 denote bit line sense enable signals for activating the bit line sense amplifiers BLSA in the bank B0 and the bank B1, respectively, and P1 denotes a first control signal.

Operation of the internal power voltage generating circuit of the conventional semiconductor memory device of FIG. 3 is described below with reference to FIG. 4.

For purposes of this description, it is assumed that at a time point t1the row activation command RASB is input and an address signal corresponding to the bank B0 is input. Also, it is assumed that at a time point t2 the row activation command RASB is input and an address signal corresponding to the bank B1 is input. In response to the row activation command RASB input at the time point t1, after a predetermined time period is lapsed, the bit line sense enable signal PSE0 is activated, and in response to the row activation command RASB input at the time point t2, after a predetermined time period is lapsed, the bit line sense enable signal PSE1 is activated.

When the bit line sense enable signal PSE0 is activated, after a predetermined time period is lapsed, the first control signal P1 having a predetermined pulse width is output, and when the bit line sense enable signal PSE1 is activated, after a predetermined time period is lapsed, the first control signal P1 having a predetermined pulse width is output.

The internal voltage driving portion 46 operates by the first control signal P1 to supply the bit line sense amplifiers BLSA with the internal power voltage AIVC.

However, the internal power voltage generating circuit of the conventional semiconductor memory device has a problem in that it cannot boost the internal power voltage AIVC to a desired level when the semiconductor memory device operates at high speed.

That is, when the internal power voltage generating circuit outputs the internal power voltage AIVC and the bit line sense amplifier BLSA performs the sensing and amplifying operation using the internal power voltage AIVC, a level of the internal power voltage AIVC suddenly drops. That is, a dip occurs in the internal power voltage AIVC. However, after the row activation command RASB for the bank B0 is input, if the time required until the row activation command RASB for the next bank B1 is input is reduced, the internal power voltage AIVC applied to the bit line sense amplifier BLSA arranged in the bank B1 does not have a sufficiently high level due to the dip. Thus, it requires a large amount of time for sensing and amplifying data and the semiconductor memory device cannot operate at high speed.

Figure 5:
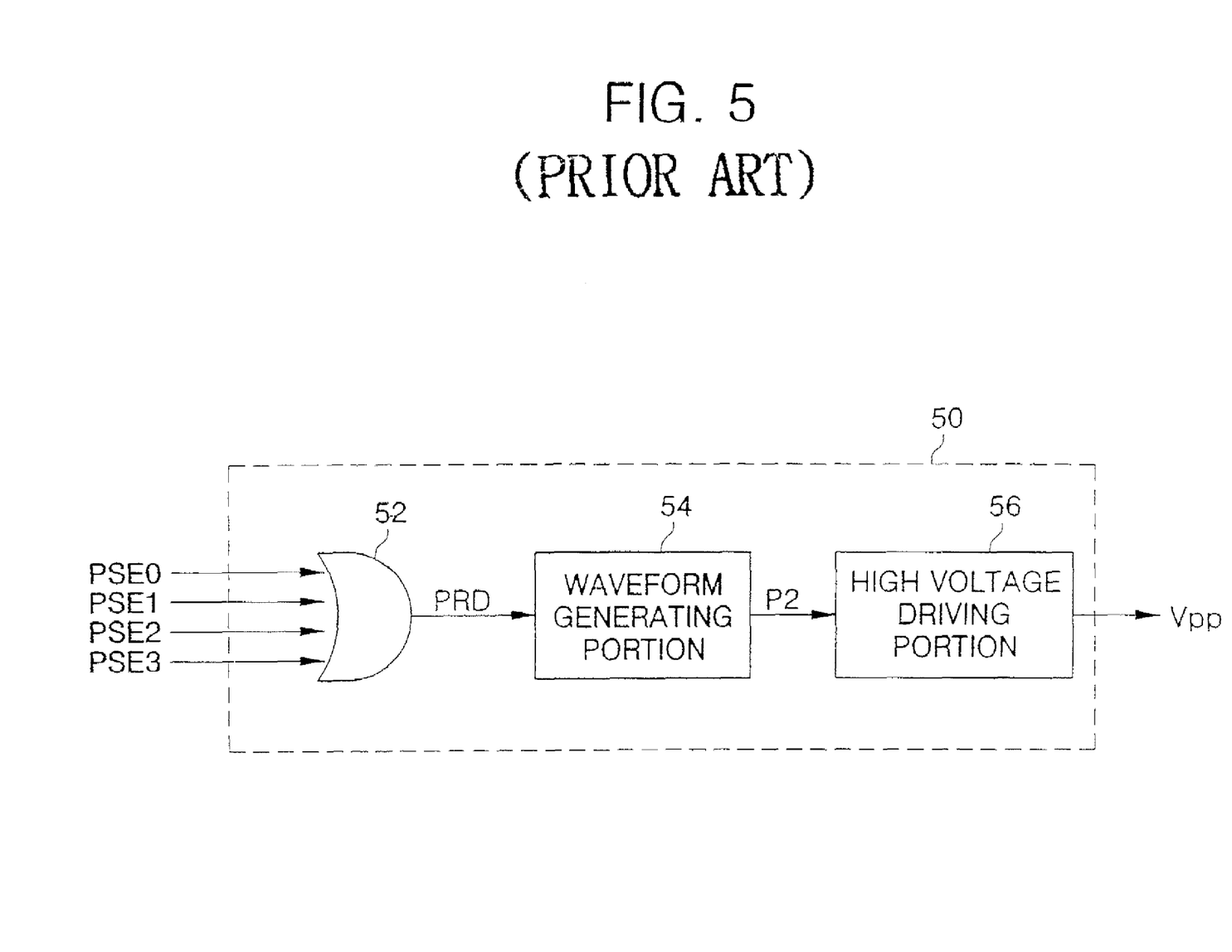
FIG. 5 is a block diagram illustrating a high voltage generating circuit of the conventional semiconductor memory device.

FIG. 5 is a block diagram illustrating the high voltage generating circuit of the conventional semiconductor memory device. The high voltage generating circuit of FIG. 5 includes an OR gate 52, a waveform generating portion 54, and a high voltage driving portion 56. In FIG. 5, PSE0 to PSE3 denote bit line sense enable signals, and Vpp denotes a high voltage.

Functions of the components of FIG. 5 are described below.

The OR gate 52 outputs a master signal PRD in response to the bit line sense enable signals PSE0 to PSE3. That is, when at least one of the bit line sense enable signals PSE0 to PSE3 is activated, the master signal PRD is activated. The waveform generating portion 54 outputs a second control signal P2 in response to the master signal PRD. That is, the waveform generating portion 54 outputs the second control signal P2 which delays the master signal PRD during a predetermined time period and has a predetermined pulse width. The high voltage driving portion 56 outputs the high voltage Vpp in response to the second control signal P2. The high voltage Vpp is needed to activate the high voltage Vpp.

However, even in this case, when certain word lines are activated using the high voltage, the dip also occurs in the high voltage Vpp. For this reason, when attempts are made to sequentially activate other word lines, a level of the high voltage Vpp is sufficiently not boosted after a second attempt.

Figure 6:
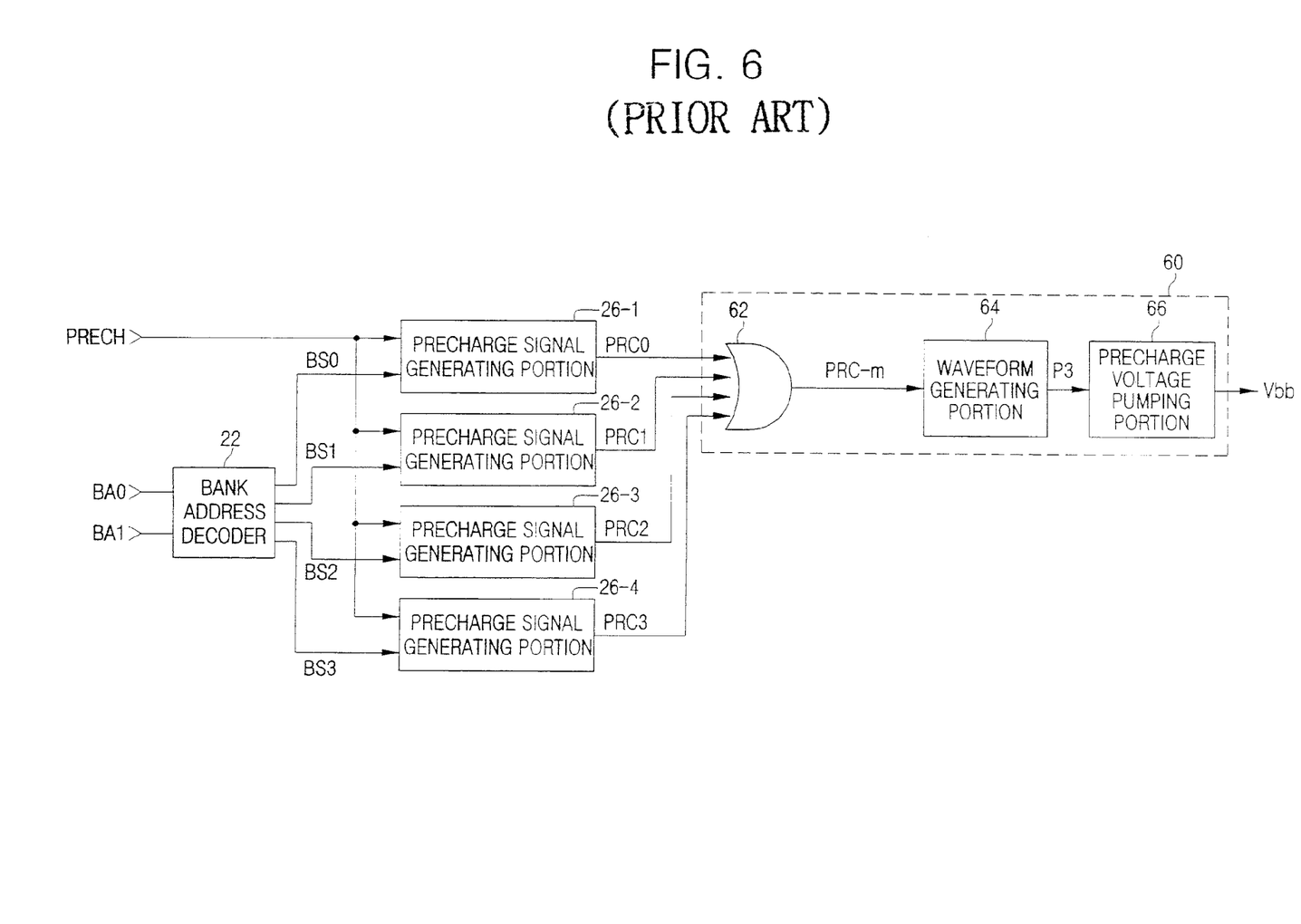
FIG. 6 is a block diagram illustrating a conventional precharge voltage generating circuit in a case where the memory cell array is comprised of four banks.

FIG. 6 is a block diagram illustrating the conventional precharge voltage generating circuit in a case where the memory cell array is comprised of four banks. The precharge voltage generating circuit of FIG. 6 includes a bank address decoder 22, four precharge signal generating portions 26-1 to 26-4, and a precharge voltage outputting portion 60. The precharge voltage generating portion 60 includes an OR gate 62, a waveform generating portion 64, and a precharge voltage pump 66.

Functions of the components of FIG. 6 are described below.

The precharge voltage generating portion of FIG. 6 has the same configuration as the internal power voltage generating circuit of FIG. 3 except that the row activation command RASB is replaced with the precharge command PRECH.

The bank address decoder 22 outputs bank selecting signals BS0 to BS3 in response to bank address signals BA0 and BA1 input from the external portion. The four precharge signal generating portions 26-1 to 26-4 output the precharge signals PRC0 to PRC3 in response to the precharge command PRECH and the bank selecting signals BS0 to BS3 input from the external portion, respectively. The precharge voltage generating portion 60 outputs the precharge voltage Vbb in response to the precharge signals PRC0 to PRC3.

The OR gate 62 outputs a precharge master signal PRC-m when at least one of the precharge signals PRC0 to PRC3 is activated. The waveform generating portion 64 outputs a third control signal P3 in response to the precharge master signal PRC-m. The precharge voltage pump 66 outputs the precharge voltage Vbb in response to the third control signal P3. The precharge voltage Vbb has a level smaller than zero (0) and is used to precharge the word line.

However, even in this case, when a plurality of word lines are sequentially precharged, a level of the precharge voltage Vbb is not adjusted to a desired level.

That is, the conventional semiconductor memory device with the multi-bank structure has a problem that a voltage level is not adjusted to a desired level to thereby lower an operation speed thereof when operation which requires a voltage of a predetermined level is continuously performed.

SUMMARY OF THE INVENTION

It is a feature of the present invention to provide a voltage generating circuit which can compensate a voltage when operation which needs a voltage of a predetermined level is continuously performed.

It is a feature of the present invention to provide a semiconductor memory device with a voltage generating circuit which can compensate a voltage when operation which needs a voltage of a predetermined level is continuously performed.

According to one aspect, the invention is directed to a voltage generating circuit, including: an internal voltage generating portion for generating an internal voltage in response to a signal input from an external portion; a sensing portion for outputting a sensing signal when the signal input from the external portion is input again within a predetermined time period; a control signal generating portion for outputting a control signal in response to the sensing signal; and a compensating portion for compensating the internal voltage in response to the control signal.

In one embodiment, the sensing portion includes a pulse generating portion for outputting a pulse signal having a predetermined pulse width when the signal is input from the external portion; and a sensing signal outputting portion for combining the pulse signal and the signal input from the external portion to output the sensing signal.

In one embodiment, the compensating portion boosts the internal voltage when a target level of the internal power voltage has a positive level.

In one embodiment, the compensating portion reduces the internal voltage when a target level of the internal power voltage has a negative level.

According to another aspect, the present invention provides a semiconductor memory device, including: a memory cell array having a plurality of banks; a voltage outputting circuit for outputting an internal voltage commonly applied to the plurality of banks in response to a command input from an external portion and a bank address signal input from an external portion; and a voltage compensating circuit for adjusting the output voltage to a predetermined level when the command is input again within a predetermined time period.

In one embodiment, the voltage compensating circuit includes a sensing portion for outputting a sensing signal when the command is input again within a predetermined time period; a control signal generating portion for outputting a control signal in response to the sensing signal; and a compensating portion for adjusting the output voltage to a predetermined level in response to the control signal.

In one embodiment, the sensing portion includes a pulse generating portion for outputting a pulse signal having a predetermined pulse width when the command is input; and a sensing signal outputting portion for combining the pulse signal and the command to output the sensing signal.

In one embodiment, the memory cell array includes a memory cell connected between a word line and a bit line pair; a word line precharging portion for precharging the word line in response to a precharge signal; and a bit line sense amplifier for sensing and amplifying a signal of the bit line pair in response to the bit line sense enable signal.

In one embodiment, the output voltage is an internal power voltage needed for sensing and amplifying data of the bit line sense amplifier, a high voltage needed for activating the word line, and/or a precharge voltage needed for precharging the word line.

A first aspect of the voltage outputting circuit includes a plurality of sensing signal generating portions for combining a row activation command input from an external portion and the bank address signals to respectively output bit line sense enable signals; and an internal voltage generating circuit for outputting an internal voltage for driving the bit line sense amplifier when at least one of the plurality of bit line sense enable signals is activated.

In one embodiment, the voltage compensating circuit includes an internal power voltage compensating circuit for increasing the internal power voltage when the row activation commands are continuously input within a predetermined time period.

A second aspect of the voltage outputting circuit includes a plurality of sensing signal generating portions for combining a row activation command input from an external portion and the bank address signals to respectively output bit line sense enable signals; and a high voltage generating circuit for outputting a high voltage for activating the word line when at least one of the plurality of bit line sense enable signals is activated.

In one embodiment, the voltage compensating circuit includes a high voltage compensating circuit for increasing the high voltage when the row activation commands are continuously input within a predetermined time period.

A third aspect of the voltage outputting circuit includes a plurality of precharge signal generating portions for combining a precharge command input from an external portion and the bank address signals to respectively output precharge signals; and a precharge voltage generating circuit for outputting a precharge voltage for precharging the word line when at least one of the plurality of bit precharge signals is activated.

The voltage compensating circuit includes a precharge voltage compensating circuit for reducing the precharge voltage when the precharge commands are continuously input within a predetermined time period.

In one embodiment, the voltage output circuit includes: a plurality of sensing signal generating portions for combining a row activation command input from an external portion and the bank address signals to respectively output bit line sense enable signals; an internal voltage generating circuit for outputting an internal voltage for driving the bit line sense amplifier when at least one of the plurality of bit line sense enable signals is activated; a high voltage generating circuit for outputting a high voltage for activating the word line when at least one of the plurality of bit line sense enable signals is activated; a plurality of precharge signal generating portions for combining a precharge command input from an external portion and the bank address signals to respectively output precharge signals; and a precharge voltage generating circuit for outputting a precharge voltage for precharging the word line when at least one of the plurality of bit precharge signals is activated.

In one embodiment, the voltage compensating circuit includes an internal power voltage compensating circuit for increasing the internal power voltage when the row activation commands are continuously input within a predetermined time period; a high voltage compensating circuit for increasing the high voltage when the row activation commands are continuously input within a predetermined time period; and a precharge voltage compensating circuit for reducing the precharge voltage when the precharge commands are continuously input within a predetermined time period.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 7:
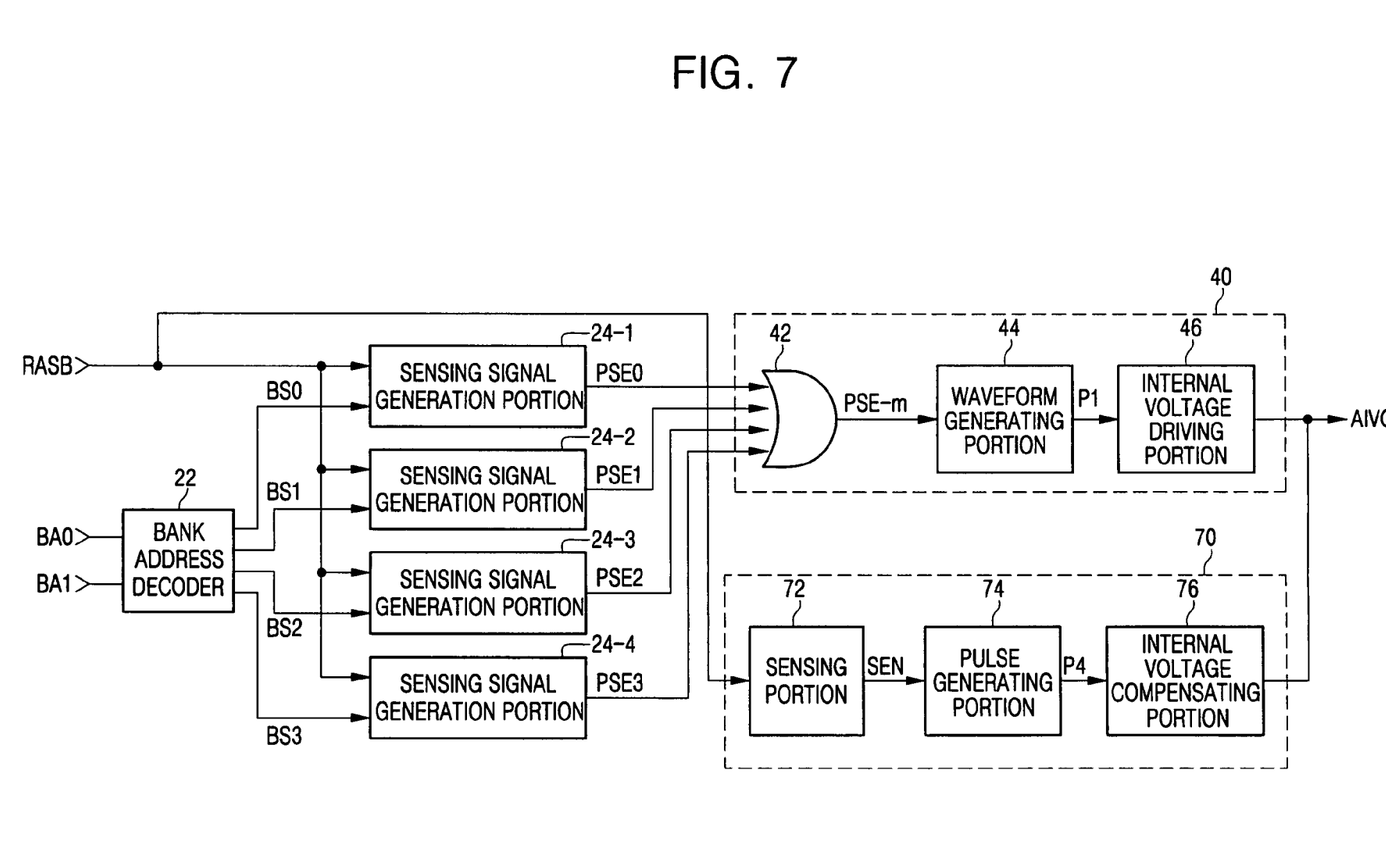
FIG. 7 is a block diagram illustrating a first embodiment of the present invention where a voltage compensating circuit is applied to an internal power voltage generating circuit.

FIG. 7 is a block diagram illustrating a first embodiment of the present invention where a voltage compensating circuit is applied to an internal power voltage generating circuit. The internal power voltage generating circuit of FIG. 7 includes a bank address decoder 22, four sensing signal generating portions 24-1 to 24-4, an internal power voltage outputting portion 40, and a voltage compensating circuit 70. The internal power voltage outputting portion 40 includes an OR gate 42, a waveform generating portion 44, and an internal voltage driving portion 46. The voltage compensating circuit 70 includes a sensing portion 72, a pulse generating portion 74, and an internal voltage compensating portion 76. That is, the voltage compensating circuit 70 is added to the conventional internal power voltage generating circuit of FIG. 3.

Like reference numerals of FIGS. 3 and 7 denote like parts and perform like operation, and thus description of those is not repeated.

The sensing portion 72 outputs a sensing signal in response to the row activation command RASB input from the external portion. That is, when the row activation signals RASB are continuously input within a predetermined time period, the sensing signal SEN is output. The pulse generating portion 74 outputs a fourth control signal P4 in response to the sensing signal SEN. That is, when the sensing signal SEN is input, after a predetermined delay time period elapses, the fourth control signal P4 having a predetermined pulse width is output. The internal voltage compensating portion 76 boosts the internal power voltage AIVC by a predetermined level in response to the fourth control signal P4.

Figure 8:
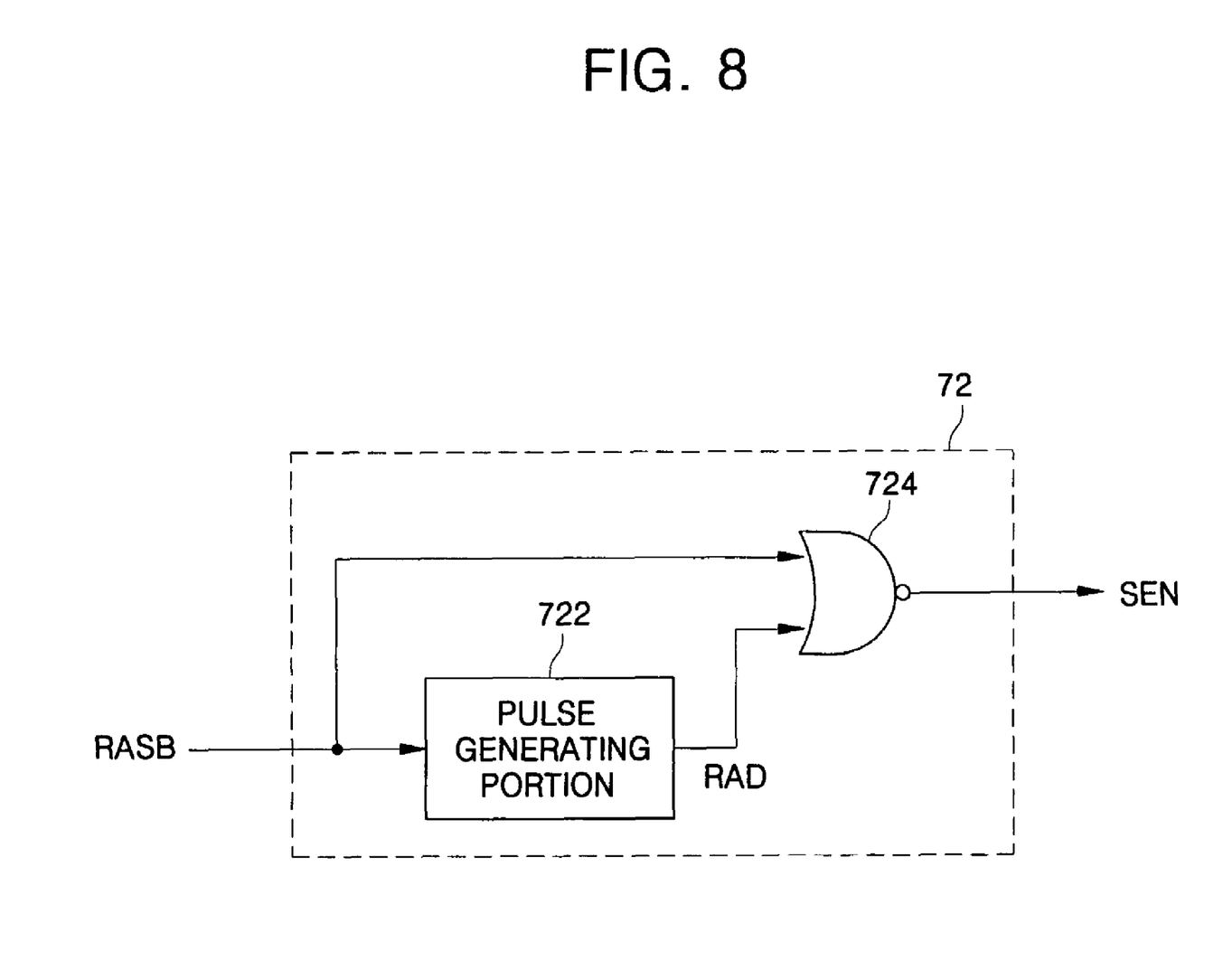
FIG. 8 is a block diagram illustrating a sensing portion of a voltage compensating circuit of FIG. 7.

FIG. 8 is a block diagram illustrating the sensing portion 72 of the voltage compensating circuit 70 of FIG. 7. The sensing portion 72 includes a pulse generating portion 722 and a NOR gate 724.

The pulse generating portion 722 outputs a pulse signal RAD in response to the row activation command RASB. That is, when the row activation command RASB is input, the pulse signal RAD having a predetermined pulse width is output. The NOR gate 724 outputs the sensing signal SEN by NORing the pulse signal RAD and the row activation command RASB.

Figure 9:
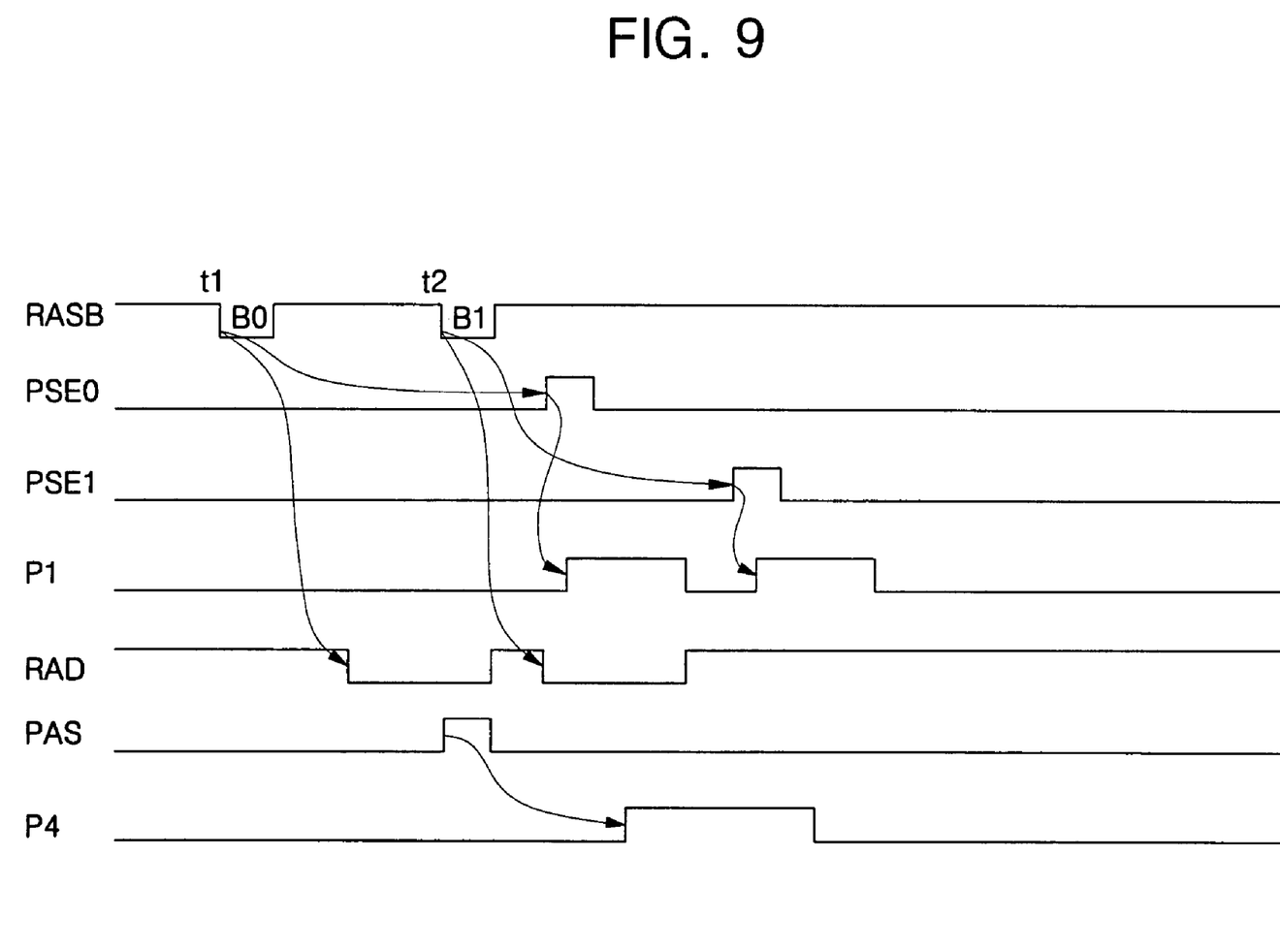
FIG. 9 is a timing diagram illustrating operation of the voltage compensating circuit of the internal power voltage generating circuit of FIGS. 7 and 8.

FIG. 9 is a timing diagram illustrating operation of the voltage compensating circuit 70 of the internal power voltage generating circuit of FIGS. 7 and 8. RASB denotes a row activation command, PSE0 and PSE1 denote bit line sense enable signals, P1 denotes a first control signal, RAD denotes a pulse signal, SEN denotes a sensing signal, and P4 denotes a fourth control signal.

Operation of the voltage compensating circuit 70 of FIGS. 7 and 8 is described below with reference to FIG. 4.

It is assumed that at a time point t1 the row activation command RASB is input and an address signal corresponding to the bank B0 is input. Also, it is assumed that at a time point t2 the row activation command RASB is input again and an address signal corresponding to the bank B1 is input. In response to the row activation command RASB input at the time point t1, after a predetermined time period is lapsed, the bit line sense enable signal PSE0 is activated, and in response to the row activation command RASB input at the time point t2, after a predetermined time period is lapsed, the bit line sense enable signal PSE1 is activated.

When the bit line sense enable signal PSE0 is activated, after a predetermined time period is lapsed, the first control signal P1 having a predetermined pulse width is output, and when the bit line sense enable signal PSE1 is activated, after a predetermined time period is lapsed, the first control signal P1 having a predetermined pulse width is output.

When the row activation command RASB is input, the pulse generating portion 722 of the sensing portion 722 outputs the pulse signal RAD having a predetermined width. By NORing the pulse signal RAD and the row activation command RASB, that is, when the row activation command RASB is input in a state that the pulse signal RAD has a low level, the sensing signal SEN has a high level. The pulse generating portion 74 of the voltage compensating circuit 70 outputs the fourth control signal P4 in response to the sensing signal SEN, and the internal voltage compensating portion 76 boosts the internal power voltage AIVC in response to the fourth control signal P4.

In the prior art, the reason that the dip occurs in the internal power voltage AIVC is because the bit line sense amplifier BLSA performs sensing and amplifying operations using the internal power voltage to thereby consume the charges and the internal voltage driving portion 46 requires time to compensate the consumed charges. At this time, when the row activation command RASB is input again, the internal power voltage AIVC is not boosted to a sufficient level and drops again. That is, if the sensing and amplifying operation is performed using the reduced internal power voltage AIVC, a lot of time is required as much, and thus the semiconductor memory device cannot operate at high speed.

However, in the present invention, when the row activation commands RASB are sequentially input within a predetermined time period, the internal voltage compensating portion 76 compensates the consumed charges to raise a level of the internal power voltage, whereby the semiconductor memory device can operate at high speed.

Figure 10:
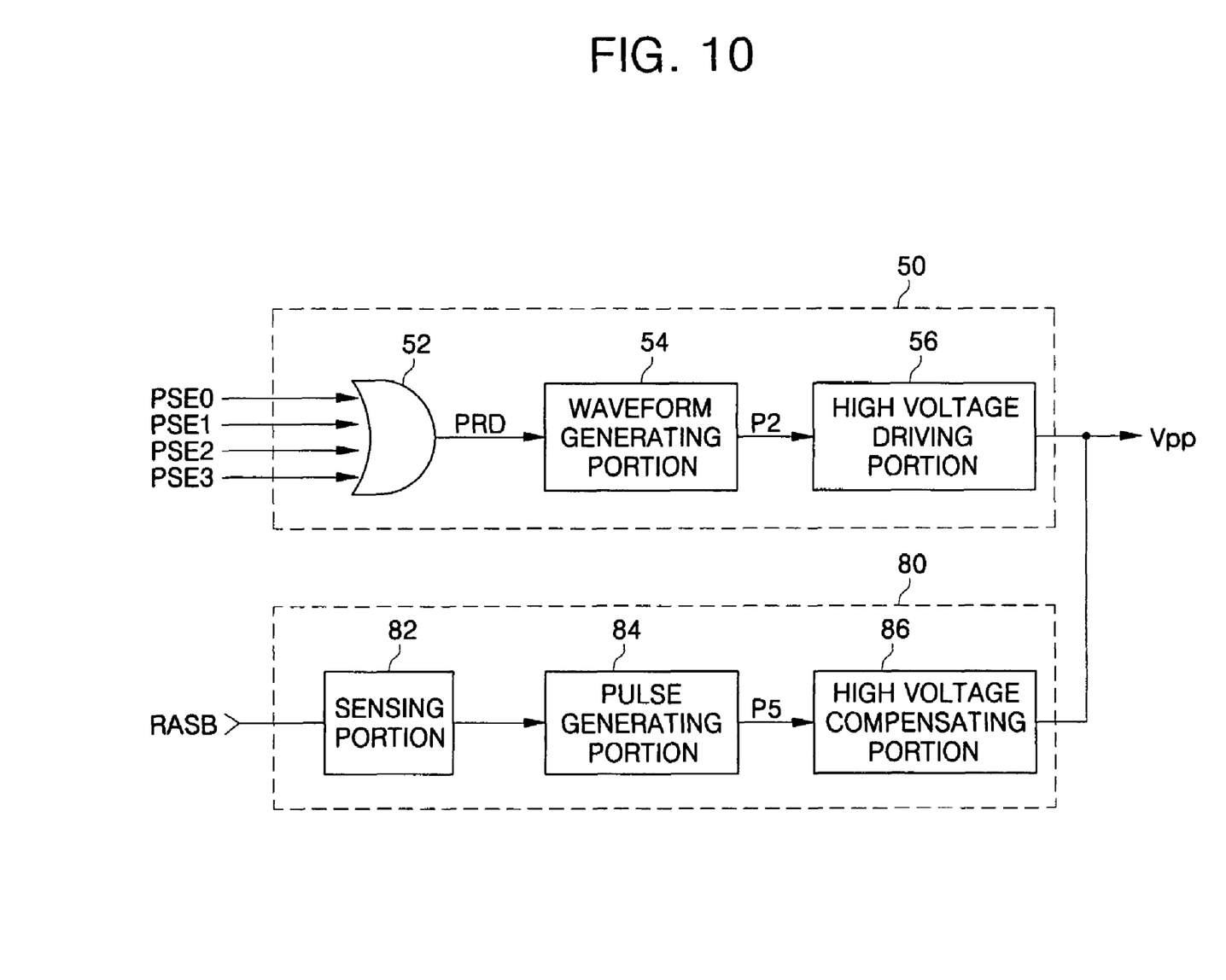
FIG. 10 is a block diagram illustrating a second embodiment of the present invention where a voltage compensating circuit is applied to a high voltage generating circuit.

FIG. 10 is distinguished from FIG. 7 in that the internal power voltage outputting portion 40 and the voltage compensating circuit 70 in FIG. 7 are replaced with the high voltage generating circuit 50 and the voltage compensating circuit 80 in FIG. 10.

Thus, the bank address decoder 22 and the four sensing signal generating portions 24-1 to 24-4 in FIG. 7 can be configured to connect to an input terminal of the high voltage generating circuit 50 in FIG. 10.

The internal components of the high voltage generating circuit 50 perform the same functions as those of FIG. 5.

The high voltage compensating circuit 80 performs similar operation to the voltage compensating circuit 70 of FIG. 7.

The sensing portion 82 outputs a sensing signal in response to the row activation command RASB input from the external portion. The sensing portion 82 has the same configuration as that of FIG. 7. The pulse generating portion 84 outputs a fifth control signal P5 in response to the sensing signal SEN. The high voltage compensating portion 86 boosts the high voltage Vpp in response to the fifth control signal P5.

In the case of the conventional art, when the row activation commands RASB are continuously input within a predetermined time period, a long time is spent in boosting the high voltage Vpp for activating the word line due to the same reason as the internal power voltage. Thus, due to the high voltage compensating circuit 80 which operates only when the row activation commands RASB are continuously input within a predetermined time period, the high voltage Vpp can be boosted to a sufficient level in a short time, whereby the semiconductor memory device can operate at high speed.

Figure 11:
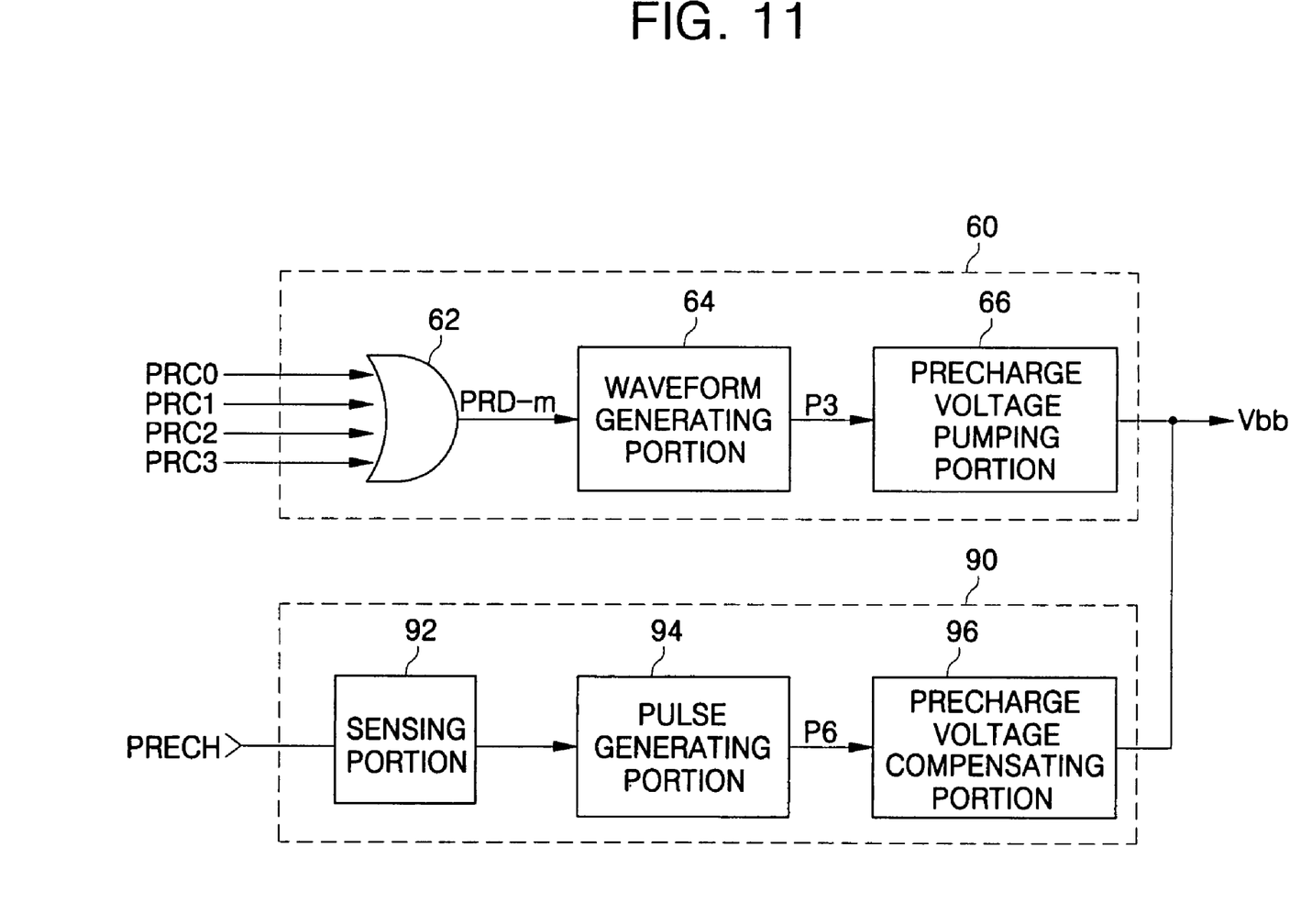
FIG. 11 is a block diagram illustrating a third embodiment of the present invention where a voltage compensating circuit is applied to a precharge voltage generating circuit.

FIG. 11 is distinguished from FIG. 6 in that the precharge voltage compensating circuit 90 in FIG. 11 is added to the precharge voltage generating circuit in FIG. 6.

Thus, the four precharge signal generating portions 26-1 to 26-4 in FIG. 6 can be configured to connect to input terminals of the precharge voltage generating circuit 60 in FIG. 11.

The internal components of the precharge voltage generating circuit 60 perform the same operation as those of the precharge voltage generating circuit of FIG. 6.

The precharge voltage compensating circuit 90 performs similar operation to the voltage compensating circuit 70 of FIG. 7. The sensing portion 92 outputs a sensing signal in response to the precharge command PRECH input from the external portion. The sensing portion 92 has the same configuration as that of FIG. 7. The pulse generating portion 94 outputs a sixth control signal P6 in response to the sensing signal SEN. The precharge voltage compensating portion 96 drops the precharge voltage Vbb in response to the sixth control signal P6.

In the case of the conventional art, when the precharge commands PRECH are continuously input within a predetermined time period, a long time is spent in dropping the precharge voltage Vbb for precharging the word line due to the same reason as the internal power voltage. Thus, due to the precharge voltage compensating circuit 90 which operates only when the precharge commands PRECH are continuously input within a predetermined time period, the precharge voltage Vbb can be dropped to a sufficient level in a short time, whereby the semiconductor memory device can operate at high speed.

Figure 12:
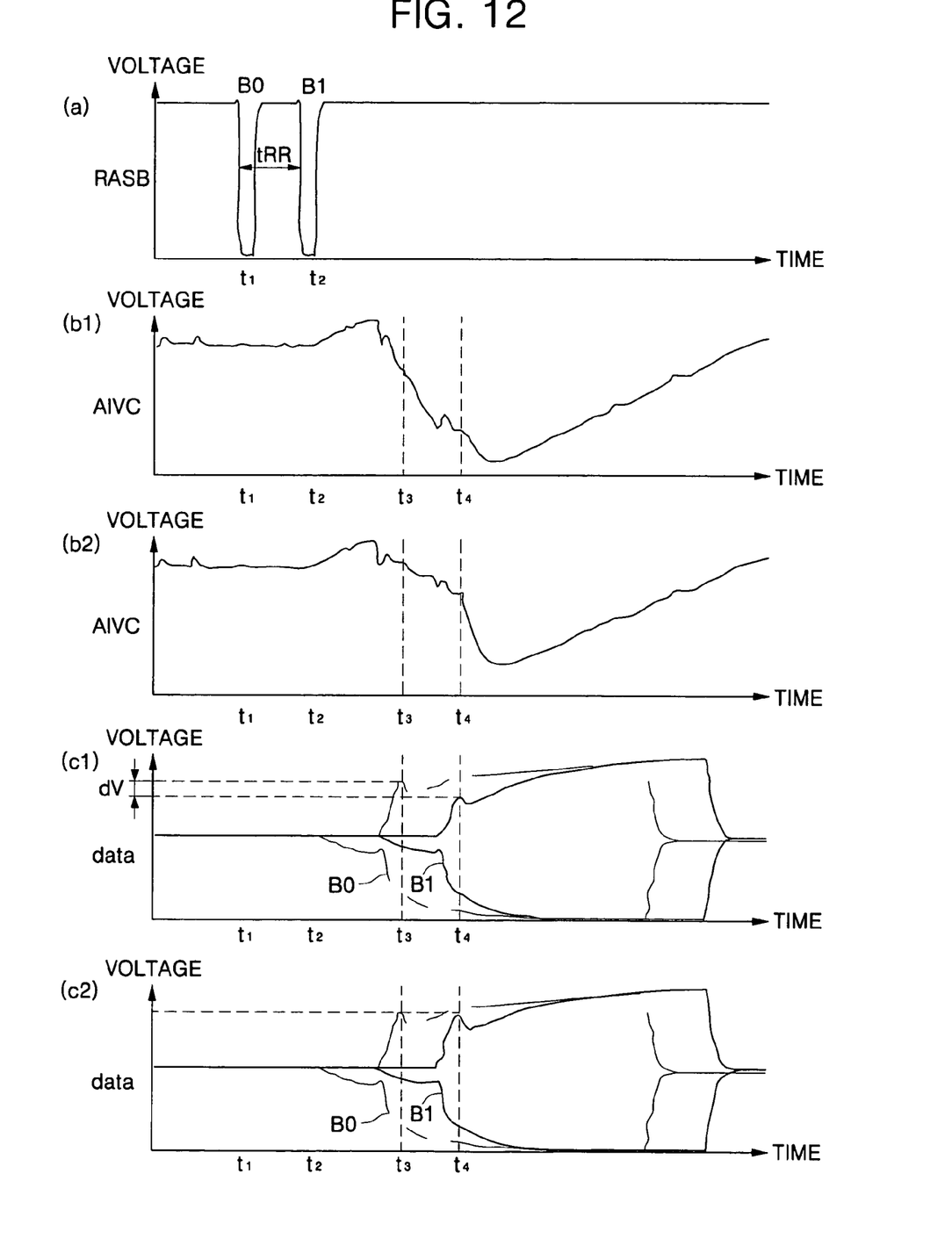
FIG. 12 shows graphs for comparing operation of the semiconductor memory device of the present invention to operation of the conventional semiconductor memory device where the voltage compensating circuit is applied to the internal power voltage generating circuit.

FIG. 12 shows graphs for comparing operation of the semiconductor memory device of the present invention to operation of the conventional semiconductor memory device where the voltage compensating circuit is applied to the internal power voltage generating circuit. In FIG. 12, RASB denotes a row activation command, AIVC denotes an internal power voltage, data denotes data of a bit line pair of the semiconductor memory device, and tRR denote a time period between input of the row activation command RASB for another bank after the row activation command RASB is input.

Graphs b1 and c1 of FIG. 12 show variation of the internal power voltage and data of the bit line pair in the conventional semiconductor memory device, graphs b2 and c2 of FIG. 12 show variation of the internal power voltage and data of the bit line pair in the semiconductor memory device of the present invention.

Comparison of operation of the semiconductor memory device of the present invention to operation of the conventional semiconductor memory device is described below with reference to FIG. 12.

It is assumed that at a time point t1 the row activation command RASB is input and an address signal corresponding to the bank B0 is input, and it is assumed that at a time point t2 the row activation command RASB is input again and an address signal corresponding to the bank B1 is input (see a graph a of FIG. 12).

As shown in the graph b1, the internal power voltage AIVC is reduced since data of the bank B0 is sensed and amplified using the internal power voltage AIVC at a time point t3 by the row activation command RASB input at the time point t1. Data of the bank B1 is sensed and amplified using the internal power voltage AIVC at a time point t4 by the row activation command RASB input at the time point t2, but even in this case, the internal power voltage AIVC of a sufficient level can not be supplied as shown in the graph b1.

However, as shown in the graph b2, when the row activation command is input again within a predetermined time period, the semiconductor memory device of the present invention compensates the internal power voltage AIVC using the voltage compensating circuit, so that the internal voltage is more boosted compared to that of the conventional semiconductor memory device shown in the graph b1.

For the foregoing reason, in case of the conventional semiconductor memory device, in sensed and amplified data of the bit line pair, data of the bank B1 are not sufficiently amplified compared to data of the bank B0 as shown in the graph c1. That is, data of the bank B1 output at the time point t4 is amplified at a lower level compared to data of the bank B0 output at the time point t3. Thus, there is a limitation to reducing a time period tRR. That is, it is difficult to operate the semiconductor memory device at high speed.

However, as shown in the graph c2, the semiconductor memory device of the present invention can amplify data of the bank B1 at the same level as data of the bank B0. Thus, the time period tRR can be significantly reduced, whereby the semiconductor memory device can operate at high speed.

The high voltage and the precharge voltage also have the same effect as the internal power voltage.

The voltage compensating circuit of the present invention makes the voltage compensating circuit operate to generate a voltage of a desired level in a short time in response to a command input from the external portion when operation which needs a predetermined level of operation is continuously performed, i.e., when the command is input again within a predetermined time period, whereby the semiconductor memory device can operate at high speed.

As described herein before, the voltage compensating circuit of the semiconductor memory device of the present invention can help the semiconductor memory device operate at high speed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device, comprising:
a memory cell array having a plurality of banks;
a voltage outputting circuit for outputting an output voltage commonly applied to the plurality of banks in response to a command input from an external portion and a bank address signal input from an external portion; and
a voltage compensating circuit for adjusting the output voltage to a predetermined level in response to the command that is input again from the external portion within a predetermined time period after the command is input from the external portion, wherein the command that is input again and the command that is input are the same command, wherein the voltage compensating circuit comprises:

a sensing portion for outputting a sensing signal when the command is input again within a predetermined time period;
a control signal generating portion for outputting a control signal in response to the sensing signal; and
a compensating portion for adjusting the output voltage to a predetermined level in response to the control signal.

2. The device of claim 1, wherein the sensing portion comprises:
a pulse generating portion for outputting a pulse signal having a predetermined pulse width when the command is input; and
a sensing signal outputting portion for combining the pulse signal and the command to output the sensing signal.

3. The device of claim 1, wherein the memory cell array comprises:
a memory cell connected between a word line and a bit line pair;
a word line precharging portion for precharging the word line in response to a precharge signal; and
a bit line sense amplifier for sensing and amplifying a signal of the bit line pair in response to the bit line sense enable signal.

4. The device of claim 3, wherein the output voltage is an internal power voltage needed for sensing and amplifying data of the bit line sense amplifier.

5. The device of claim 3, wherein the output voltage is a high voltage needed for activating the word line.

6. The device of claim 3, wherein the output voltage is a precharge voltage needed for precharging the word line.

7. The device of claim 3, wherein the voltage outputting circuit comprises:
a plurality of sensing signal generating portions for combining a row activation command input from an external portion and the bank address signals to respectively output bit line sense enable signals; and
an internal voltage generating circuit for outputting the output signal as an internal voltage for driving the bit line sense amplifier when at least one of the plurality of bit line sense enable signals is activated.

8. The device of claim 7, wherein the voltage compensating circuit includes an internal power voltage compensating circuit for increasing the internal power voltage when the row activation commands are continuously input within a predetermined time period.

9. The device of claim 3, wherein the voltage outputting circuit comprises:
a plurality of sensing signal generating portions for combining a row activation command input from an external portion and the bank address signals to respectively output bit line sense enable signals; and
a high voltage generating circuit for outputting the output voltage as a high voltage for activating the word line when at least one of the plurality of bit line sense enable signals is activated.

10. The device of claim 9, wherein the voltage compensating circuit includes a high voltage compensating circuit for increasing the high voltage when the row activation commands are continuously input within a predetermined time period.

11. The device of claim 3, wherein the voltage outputting circuit comprises:
a plurality of precharge signal generating portions for combining a precharge command input from an external portion and the bank address signals to respectively output precharge signals; and
a precharge voltage generating circuit for outputting the output voltage as a precharge voltage for precharging the word line when at least one of the plurality of precharge signals is activated.

12. The device of claim 9, wherein the voltage compensating circuit includes a precharge voltage compensating circuit for reducing the precharge voltage when the precharge commands are continuously input within a predetermined time period.

13. The device of claim 3, wherein the voltage output circuit comprises:
a plurality of sensing signal generating portions for combining a row activation command input from an external portion and the bank address signals to respectively output bit line sense enable signals;
an internal voltage generating circuit for outputting the output voltage as an internal voltage for driving the bit line sense amplifier when at least one of the plurality of bit line sense enable signals is activated;
a high voltage generating circuit for outputting the output voltage as a high voltage for activating the word line when at least one of the plurality of bit line sense enable signals is activated;
a plurality of precharge signal generating portions for combining a precharge command input from an external portion and the bank address signals to respectively output precharge signals; and
a precharge voltage generating circuit for outputting the output voltage as a precharge voltage for precharging the word line when at least one of the plurality of precharge signals is activated.

14. The device of claim 13, wherein the voltage compensating circuit comprises:
an internal power voltage compensating circuit for increasing the internal power voltage when the row activation commands are continuously input within a predetermined time period;
a high voltage compensating circuit for increasing the high voltage when the row activation commands are continuously input within a predetermined time period; and
a precharge voltage compensating circuit for reducing the precharge voltage when the precharge commands are continuously input within a predetermined time period.

* * * * *